United States Patent
Ishikawa

(10) Patent No.: US 10,584,431 B2
(45) Date of Patent: Mar. 10, 2020

(54) METAL FABRIC, INTERIOR DECORATION, PARTITION MEMBER, CLOTHING, AND ELECTROMAGNETIC SHIELDING MEMBER

(71) Applicant: Ishikawa Wire Netting Co., Ltd., Tokyo (JP)

(72) Inventor: Yukio Ishikawa, Tokyo (JP)

(73) Assignee: ISHIKAWA WIRE NETTING CO., LTD., Tokyo (JP)

( * ) Notice: Subject to any disclaimer, the term of this patent is extended or adjusted under 35 U.S.C. 154(b) by 227 days.

(21) Appl. No.: 15/316,270

(22) PCT Filed: Jul. 27, 2015

(86) PCT No.: PCT/JP2015/071286
§ 371 (c)(1),
(2) Date: Dec. 5, 2016

(87) PCT Pub. No.: WO2016/017595
PCT Pub. Date: Feb. 4, 2016

(65) Prior Publication Data
US 2017/0198422 A1 Jul. 13, 2017

(30) Foreign Application Priority Data
Jul. 28, 2014 (JP) .................................. 2014-153004

(51) Int. Cl.
*D03D 15/02* (2006.01)
*D03D 1/00* (2006.01)
(Continued)

(52) U.S. Cl.
CPC .............. *D03D 15/02* (2013.01); *A41D 27/10* (2013.01); *A41D 31/00* (2013.01); *A47H 1/02* (2013.01);
(Continued)

(58) Field of Classification Search
USPC ........................................................ 442/229
See application file for complete search history.

(56) References Cited

U.S. PATENT DOCUMENTS

| 4,793,130 A | 12/1988 | Togashi et al. |
| 5,422,462 A * | 6/1995 | Kishimoto ........... H05B 1/0272 219/529 |

(Continued)

FOREIGN PATENT DOCUMENTS

| JP | S63001400 U | 1/1988 |
| JP | 5-496 U | 1/1993 |

(Continued)

OTHER PUBLICATIONS

International Search Report dated Oct. 13, 2015, issued in counterpart application No. PCT/JP2015/071286 with English translation. (3 pages).

(Continued)

Primary Examiner — Lynda Salvatore
(74) Attorney, Agent, or Firm — Westerman, Hattori, Daniels & Adrian, LLP

(57) ABSTRACT

A metal fabric (10) uses warp metal wires (40) as the warp, and weft metal wires (50) as the weft, where the warp metal wires (40) and the weft metal wires (50) are composed of different metal materials. A curtain (100) as an interior decoration uses the metal fabric (10). A partition member (200) is configured to have the metal fabric (10) and a frame (210) which supports the outer circumference of the metal fabric (10). A clothing is configured to contain the metal fabric (10), and an electromagnetic shielding member is configured to contain the metal fabric (10).

16 Claims, 9 Drawing Sheets

(51) Int. Cl.

| | | |
|---|---|---|
| *E04B 2/74* | (2006.01) | |
| *E04C 2/38* | (2006.01) | |
| *A47H 23/08* | (2006.01) | |
| *A41D 27/10* | (2006.01) | |
| *A41D 31/00* | (2019.01) | |
| *A47H 1/02* | (2006.01) | |
| *A47H 1/18* | (2006.01) | |
| *E04B 1/92* | (2006.01) | |
| *E04B 2/72* | (2006.01) | |
| *E04C 2/08* | (2006.01) | |
| *H05K 9/00* | (2006.01) | |
| *A41D 1/16* | (2006.01) | |
| *A41D 13/04* | (2006.01) | |

(52) U.S. Cl.
CPC ............... *A47H 1/18* (2013.01); *A47H 23/08* (2013.01); *D03D 1/0058* (2013.01); *E04B 1/92* (2013.01); *E04B 2/72* (2013.01); *E04B 2/74* (2013.01); *E04B 2/7422* (2013.01); *E04C 2/08* (2013.01); *E04C 2/384* (2013.01); *H05K 9/009* (2013.01); *A41D 1/16* (2013.01); *A41D 13/043* (2013.01); *A41D 2400/26* (2013.01); *A41D 2500/20* (2013.01); *A47H 2001/0215* (2013.01); *D10B 2101/20* (2013.01); *D10B 2503/02* (2013.01); *D10B 2503/04* (2013.01); *E04B 2001/925* (2013.01)

(56) References Cited

U.S. PATENT DOCUMENTS

| | | |
|---|---|---|
| 6,887,806 B2 | 5/2005 | Vanassche et al. |
| 2003/0082336 A1 | 5/2003 | Braekevelt |
| 2008/0096451 A1* | 4/2008 | Haerle ............... B60R 13/0876 442/221 |

FOREIGN PATENT DOCUMENTS

| | | |
|---|---|---|
| JP | H05267883 A | 10/1993 |
| JP | 9-23085 A | 1/1997 |
| JP | 2003-517110 A | 5/2003 |
| JP | 2003-268649 A | 9/2003 |
| JP | 2003532807 A | 11/2003 |
| JP | 2009-062639 A | 3/2009 |

OTHER PUBLICATIONS

Document submitted with Japan Patent Office on Aug. 21, 2014 to apply an exception of loss of novelty under Article 30 of Japan Patent Law, submitted in Japan Patent Application No. 2014-153004, along with concise explanation (4 pages).

Document submitted with Japan Patent Office on Aug. 24, 2015 to apply an exception of loss of novelty under Article 30 of Japan Patent Law, submitted in Japan Patent Application No. 2015-147856, along with concise explanation (4 pages).

Office Action dated Aug. 15, 2017, issued in Japanese Patent Application No. 2015-147856, with translation.

* cited by examiner

METAL FABRIC, INTERIOR DECORATION, PARTITION MEMBER, CLOTHING, AND ELECTROMAGNETIC SHIELDING MEMBER

TECHNICAL FIELD

This invention relates to a metal fabric; and, an interior decoration, a partition member, clothing and an electromagnetic shielding member using the metal fabric.

BACKGROUND ART

There have been proposed a variety of metal fabrics which uses metal wire materials as the warp and weft (referred to as "conventional metal fabrics", hereinafter).

For example, Patent Literature 1 describes a mesh component specially designed so as to make, without coloring, a concentric shadow pattern visible on the mesh surface (also referred to as "Prior Art 1", hereinafter). Prior Art 1 utilizes a plurality of mesh materials, among which at least one mesh material has the apex in a center part and is gently bent down to the periphery. Prior Art 1 is configured by stacking a plurality of mesh materials so as to direct the center part outwardly. Prior Art 1, when viewed from the front to the rear through the mesh, allows the viewer to recognize the rear metal wires positioned at different levels of height. Moreover, since the point of recognition of the rear metal wires varies depending on the degree of warping of the mesh material, so that Prior Art 1 successfully makes the viewer to recognize the concentric shadow pattern on the mesh surface, without coloring the metal wire materials.

Patent Literature 2 describes a bag-like article made of a multi-fiber twill fabric using ultra-thin metal wires, which is used as a low-frequency magnetic shielding material (also referred to as "Prior Art 2", hereinafter). More specifically, Prior Art 2, being formed by weaving ultra-thin metal wires of 100 μm or smaller in diameter typically by twill weaving, can acquire both of a texture of cloth, and a performance of metal called magnetic shielding.

As exemplified by Patent Literature 1 and Patent Literature 2, a variety of metal fabrics have been proposed.

CITATION LIST

Patent Literature

[Patent Literature 1] JP-U-H05-496
[Patent Literature 2] JP-A-H09-23085

SUMMARY OF THE INVENTION

Technical Problem

By the way, all conventional metal fabrics, including those described in Patent Literature 1 and Patent Literature 2, use the same species of metal material both for the metal wires composing the warp and the metal wires composing the weft. This is not only because it is a traditional custom, but also as a result of choice based on a technical common sense, aimed at providing an isotropic metal fabric having vertical and lateral physical properties well-balanced in the metal fabric.

The present inventors, however, noticed from our extensive investigations into development of new applications of the metal fabric, that the technical common sense, regarding use of the same species of metal material both for the warp and weft, has inhibited the metal fabric from further advancement. The present inventors then went through studies aiming at providing an unprecedented, novel and useful metal fabric, and various products using the same, without sticking to the common sense.

This invention conceived taking these problems into consideration. That is, this invention is to provide an unprecedented, novel and useful metal fabric, and various products using the same.

Solution to Problem

According to this invention, there is provided a metal fabric which includes warp metal wires as the warp, and weft metal wires as the weft, the warp metal wires and the weft metal wires being composed of different metal materials.

According to this invention, there is also provided an interior decoration configured by using the metal fabric of this invention.

According to this invention, there is also provided a partition member which includes the metal fabric of this invention, and a frame which supports the outer circumference of the metal fabric.

According to this invention, there is also provided a clothing configured to contain the metal fabric of this invention.

According to this invention, there is also provided an electromagnetic shielding member configured to contain the metal fabric of this invention.

Advantageous Effects of Invention

The metal fabric of this invention has the warp metal wires and the weft metal wires composed of different metal materials. With such configuration, the metal fabric of this invention came to demonstrate novel and useful properties having never been demonstrated by the conventional metal fabrics.

Effects of this invention as solutions to the individual, specific problems of the conventional metal fabrics will be detailed with reference to specific embodiments later in this specification.

The interior decoration, the partition member, the clothing, and the electromagnetic shielding member of this invention, using the metal fabric of this invention, demonstrate effects which are excellent over those of various products using the conventional metal fabric, owing to such novel and useful properties demonstrated by the metal fabric of this invention.

BRIEF DESCRIPTION OF DRAWINGS

The above and other objects, features and advantages of this invention will be more apparent from the following description of certain preferred embodiments taken in conjunction with the accompanying drawings.

DESCRIPTION OF EMBODIMENTS

Figure 1A:
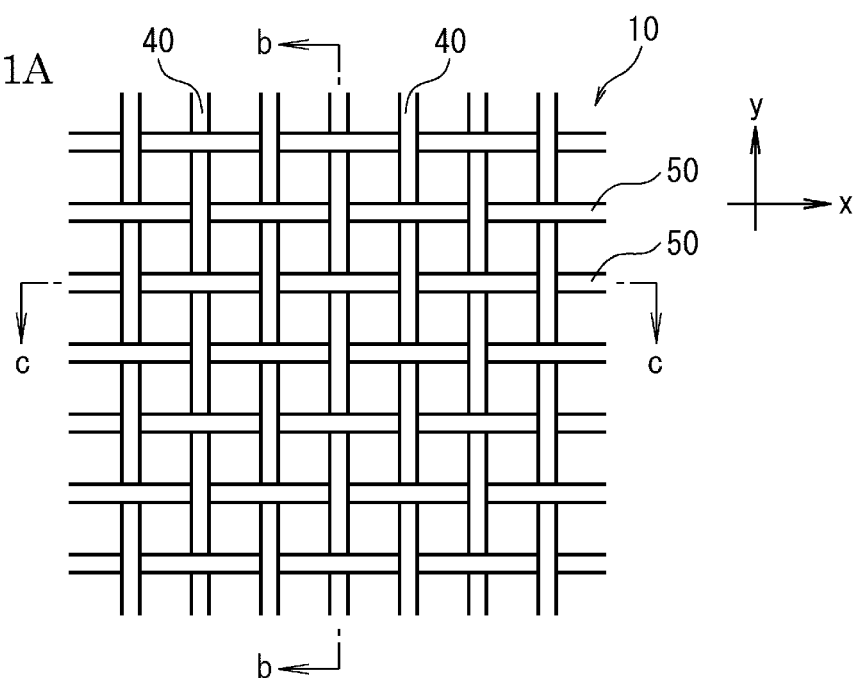
FIG. 1A is an enlarged front view of a metal fabric according to a first embodiment of this invention.

Embodiments of this invention will be explained below referring to the attached drawings. In all drawings, all similar constituent will be given the same reference signs to suitably avoid repetitive explanation. In the embodiments, explanation will occasionally be made while defining the front, rear, left, right, top and bottom directions, or, the x-axis and y-axis directions as illustrated in the drawings. However, the definition is merely for the convenience of simply explaining relative relations among the constituents, without limiting directions of the products which embody this invention when they are manufactured or used.

The term "warp" in this invention means the metal wires which extend in the longitudinal direction of the metal fabric woven in the form of long web. The term "weft" in this invention means the metal wires woven, relative to the warp, in other direction (typically in the vertical direction).

The term "metal wires" in the context of this specification means metal element wires used when the metal fabric is woven, and includes metal filament, and strand wire obtained by twisting a plurality of metal element wires. The metal wires include those having the constitutive metal exposed, and those having a coating on at least a part of the outer circumference.

The metal fabric of this invention, and the constituents using the metal fabric of this invention in the individual embodiments are not always necessarily be independent entities, instead allowing typically that a plurality of constituents are formed as a single member, that a single constituent is formed by a plurality of members, that one constituent forms a part of other constituent, and that a part of one constituent overlaps a part of other constituent.

<First Embodiment>

With respect to the metal fabric of this invention, a configuration of a metal fabric 10, as the first embodiment of this invention, will be explained referring to FIG. 1A to FIG. 1C.

Figure 1B:
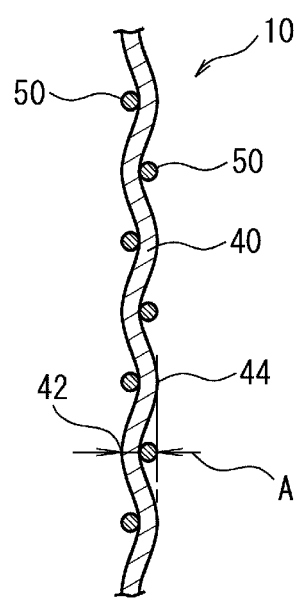
FIG. 1B is a cross-sectional view taken along line b-b in FIG. 1A.
Figure 1C:
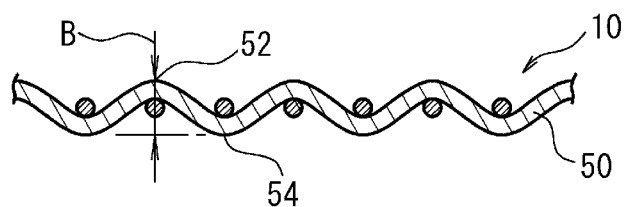
FIG. 1C is a cross-sectional view taken along line c-c in FIG. 1A.

FIG. 1A is an enlarged front view of the metal fabric 10 according to the first embodiment of this invention, FIG. 1B is a cross-sectional view taken along line b-b in FIG. 1A, and FIG. 1C is a cross-sectional view taken along line c-c in FIG. 1A.

The metal fabric 10 uses warp metal wires 40 as the warp, and uses weft metal wires 50 as the weft. The metal fabric 10 is characterized in that the warp metal wires 40 and the weft metal wires 50 are composed of different metal materials.

In other words, in the metal fabric 10, a metal material composing the warp metal wires 40 and a metal material composing the weft metal wires 50 are different. Now, "one metal material and other metal material are different" means any one of the cases where both of them are different simple metals; where one material is a simple metal, and the other material is an alloy; where alloys composing both metal materials have different compositions; and where the alloys composing both metal materials have the same composition but different compositional ratios.

As a result of using the warp metal wires 40 and the weft metal wires 50 composed of different metal materials, the metal fabric 10 now breaks the technical common sense regarding the conventional metal fabrics described above, and acquires novel and useful properties having never been demonstrated by the conventional metal fabrics.

More specifically, the conventional metal fabrics have been configured by using the metal wires composed of the same metal material for both of the warp and weft, only to show equivalent levels of physical properties and texture both in the warp direction and weft direction. In most cases, the conventional metal fabrics have, therefore, been used only limitedly for metal filter, gauge and so forth.

For example, where ultra-thin metal wires are used for the warp and weft as in Prior Art 2, a texture of cloth might be demonstrated in the vertical and lateral directions, but metal properties such as rigidity and shape retainability would be lost. On the contrary, if rigidity or shape retainability were focused in the conventional metal fabric, the fabric would fail to demonstrate the texture of cloth.

More specifically, for example, efforts to form an article, such as tea strainer which is necessarily be formed by deep drawing, using the conventional metal fabrics have resulted in a nonconformity that the metal wires would break at the intersection of the warp and weft in the curved face. Although such breakage might be avoidable to a certain extent, by choosing ultra-thin metal wires, or metal wires mainly composed of a soft metal, the shape retainability would degrade as a consequence. For this reason, the conventional metal fabrics have been not suitable for deep drawing. Now, "deep drawing" in the context of this specification means that a bottomed article with a cylindrical or conical side face is formed from a sheet of metal fabric by press working.

The conventional metal fabrics per se have no special design quality, so that any design quality has been given only by a special structure such as Prior Art 1 described above, or by an additional post-process such as coloring.

The metal fabric 10 succeeds to demonstrate different physical properties or textures in the warp direction and the weft direction, as a result of choosing the metal wires composed of different metal materials respectively for the warp metal wires 40 and the weft metal wires 50. This successfully solves the various problems in the conventional metal fabrics described above. Preferred physical properties or textures to be demonstrated by the metal fabric 10 may suitably be modified, taking the applications into consideration, based on species and/or combination of the metal materials for the warp metal wires 40 and the weft metal wires 50 to be selected. The individual and specific effects of the metal fabric 10 will be explained in the following description.

The metal fabric 10 will be detailed below.

The metal fabric 10 of this embodiment is, as illustrated in FIG. 1A to FIG. 1C, a plain weave fabric using the metal wires 40 and the weft metal wires 50. This is, however, one example of the way of weaving of the metal fabric 10, so that the metal fabric 10 may alternatively be a fabric woven by any other method using the warp and weft, including twilled weave, Dutch weave and twilled Dutch weave. The warp metal wires 40 are metal wires used as the warp of the metal fabric 10, meanwhile the weft metal wires 50 are metal wires used as the weft of the metal fabric 10.

Each of the metal materials composing the warp metal wires 40 and the weft metal wires 50 may be a metal simple substance or an alloy. For example, the warp metal wires 40 may be metal wires composed of a single species of alloy, and the weft metal wires 50 may be metal wires composed of any other species of alloy. Alternatively, the warp metal wires 40 may be metal wires composed of one metal simple substance, and the weft metal wires 50 may be metal wires composed of any other metal simple substance. Alternatively, either the warp metal wires 40 or the weft metal wires 50 may be metal wires composed of a metal simple substance, and the other may be metal wires composed of an alloy.

In one preferred example of this embodiment, the metal fabric 10 may be configured so that the principal component of metal contained in the warp metal wires 40 is different from the principal component of metal contained in the weft metal wires 50. This is because the metal fabric 10 will have physical properties and textures largely differed between the warp direction and the weft direction, and can suitably demonstrate the effects of this invention.

When the metal wires composing the warp metal wires 40 are composed of a metal simple substance, the principal component of metal contained in the warp metal wires 40 is the metal simple substance as a matter of course, meanwhile when composed of an alloy, it means a metal whose content is largest in the alloy. The same will also apply to the principal component of metal contained in the weft metal wires 50.

The metal materials composing the warp metal wires 40 and the weft metal wires 50 are suitably selectable from metal simple substance and alloy which are usable for the metal wires.

Specific examples of the metal simple substance include, but not limited to, copper, aluminum, nickel, titanium, gold, silver, platinum, iron, zinc, tin and lead.

Specific examples of the alloy include, but not limited to, stainless steel, brass and galvanized steel. The stainless steel is an alloy mainly composed of iron (50% or more, for example), containing chromium (10.5% or more, for example). Stainless steel is specified as SUS in the JIS, among which SUS304, SUS316, SUS316L and SUS310S, for example, are suitable for the metal material composing the warp metal wires 40 or the weft metal wires 50. Brass is an alloy containing copper and zinc. Typical brass contains 20% or more of zinc. Galvanized steel is a zinc-plated steel.

A large number of warp metal wires 40 may be a bundle of a plurality of metal wires composed of the same metal material, or may be a mixture of a plurality of metal wires respectively composed of a plurality of species of metal materials different from each other. For example, a plurality of metal wires composed of a first metal material such as SUS, and a plurality of metal wires composed of a second metal material such as brass, may be arranged alternatively one by one, or several by several, to thereby form the warp metal wires 40. Similarly, a large number of weft metal wires 50 may be a bundle of a plurality of metal wires composed of the same metal material, or may be a mixture of a plurality of metal wires respectively composed of a plurality of species of metal materials different from each other.

In one possible configuration, one of the warp metal wires 40 and the weft metal wires 50 is a mixture which contains the metal wires composed of the first metal material and the metal wires composed of a second metal material, and, the other one of the warp metal wires 40 and the weft metal wires 50 does not contain the metal wires composed of the first metal material, but contains the metal wires composed of the second metal material. In short, the warp metal wires 40 and the weft metal wires 50 may contain the metal wires composed of the same metal material. For example, the warp metal wires 40 may be a mixture of the metal wires of the first metal material and the metal wires of the second metal material, and the weft metal wires 50 may be configured solely by using the metal wires of the second metal material. Conversely, the warp metal wires 40 may be configured solely by using the metal wires of the first metal material, and the weft metal wires 50 may be a mixture of the metal wires of the first metal material and the metal wires of the second metal material. Alternatively, the warp metal wires 40 may be a mixture of the metal wires of the first metal material and the metal wires of the second metal material, and the weft metal wires 50 may be a mixture of the metal wires of the second metal material and the metal wires of a third metal material.

In one example, the warp metal wires 40 may be a mixture of a plurality of SUS metal wires and a plurality of brass metal wires, meanwhile the weft metal wires 50 may be configured solely by using the SUS metal wires, or solely by using the brass metal wires.

In this invention, the phrase of "the warp metal wires 40 and the weft metal wires 50 are composed of different metal materials" also represents the case where, as described above, at least one of the warp metal wires 40 and the weft metal wires 50 contains the metal wires composed of a metal material not contained in the other.

In one possible configuration, both of the warp metal wires 40 and the weft metal wires 50 are respective mixtures each containing the metal wires composed of the first metal material and the metal wires composed of the second metal material, wherein the ratio of the numbers of the metal wires composed of the first metal material and the metal wires composed of the second metal material are different between the warp metal wires 40 and the weft metal wires 50. With such configuration, the average physical property of a large number of warp metal wires 40 is made different from the average physical property of the large number of weft metal wires 50.

In this invention, as described above, both of the warp metal wires 40 and the weft metal wires 50 may be mixtures each containing the metal wires composed of a plurality of species of, and the same metal materials. Even this case is represented by the phrase of "the warp metal wires 40 and the weft metal wires 50 are composed of different metal materials", if the ratio of the number of metal wires composed of the plurality of species of metal materials is different between the warp metal wires 40 and the weft metal wires 50.

The metal fabric 10 of this embodiment has different values of flexural strength in the warp direction and in the weft direction.

With such configuration, it now becomes possible to make the flexibility different between the warp direction and the weft direction, and to allow the metal fabric 10 to demonstrate effects which have not been found in the conventional metal fabrics. More specifically, the metal fabric 10 can demonstrate rigidity of an ordinary metal fabric either in the warp direction or in the weft direction, and can be made, in the other direction, softer than the ordinary metal fabric, to demonstrate a flexibility just like cloth.

The flexural strength of the metal fabric 10 may be measured in accordance with JIS Z 7171 (2008) which specifies methods of determining flexural properties of resin materials. More specifically, the metal fabric 10 is cut into an 80 mm (warp direction)×10 mm (weft direction) rectangular test piece to prepare a first test piece. Similarly, the metal fabric 10 is cut into an 80 mm (weft direction)×10 mm (warp direction) rectangular test piece to prepare a second test piece. Each of the first test piece and the second test piece is supported with a support span of 64 mm, a 5 mm radius indenter is pressed against the center between the supports at a press speed of 2 mm/min, so as to pressurize the test piece under a predetermined load in the direction of gravity. Amounts of deflection (mm) of the first test piece and the second test piece are measured in this way. The flexural strength in this invention represents resistance to deformation under flexural load. For example, if the first test piece shows an amount of deflection smaller than that shown by the second test piece, the metal fabric 10 is determined to have a large flexural strength in the warp direction. A testing apparatus used for the flexural test is not specifically limited so long as it can perform the three-point flexural test described above, and is typified by Autograph Precision Universal Testing Machine (from Shimadzu Corporation).

The predetermined load employed in the flexural test may be determined in a preliminary test, in which two test pieces based on the same specifications as the first test piece and the second test piece are prepared, maximum flexural load (N) is determined for both of them respectively, and the predetermined load is suitably determined within a load range (N) not larger than the smaller maximum flexural load (N). The predetermined load may be set, for example, to the half of the smaller maximum flexural load (N).

A specific means for making a difference between the flexural strength of the metal fabric 10 in the warp direction and the flexural strength in the weft direction may be such as making a difference between the flexural strength of the warp metal wires 40 and the flexural strength of the weft metal wires 50.

When the warp metal wires 40 and the weft metal wires 50 have different levels of flexural strength, it now becomes possible to make a difference between the flexural strength of the metal fabric 10 in the warp direction and the flexural strength in the weft direction, while leaving the number of metal wires almost equal in the warp direction and in the weft direction.

When the thus configured metal fabric 10 is subjected to deep drawing, the metal wires which extend in the direction, along which the flexural strength is relatively small, can suitably deform in a deflected portion. Accordingly, the metal wires which extend in the direction, along which the flexural strength is relatively large, may be reduced in load for deflection, and thereby the metal wires are suitably prevented from breaking at the intersection of the warp and the weft.

The flexural strength of the warp metal wires 40 and the weft metal wires 50 are measured as described below. First, short pieces of 80 mm long are cut out respectively from the warp metal wires 40 and the weft metal wires 50, respectively named a third test piece and a fourth test piece. The third test piece is then supported at both ends with a support span of 64 mm, a weight of a predetermined load is suspended at the center between the supports, and the amount of deflection (mm) is measured. Also the fourth test piece is measured in the same way. In this way, resistance to deformation of the third test piece and the fourth test piece may be measured. For example, if the third test piece shows an amount of deflection smaller than the fourth test piece shows, the warp metal wires 40 will be judged to have a larger flexural strength than the weft metal wires 50 have.

If the warp metal wires 40 or the weft metal wires 50 are unable to be subjected to the flexural test by a single wire, a plurality of short test pieces of 80 mm long, cut from the warp metal wires 40 or the weft metal wires 50 are prepared. A predetermined number of the respective short pieces are bundled, and wound with a tape at both ends and the center. These may be used as the third test piece of the warp metal wires 40 and the fourth test piece of the weft metal wires 50. In view of comparing the flexural strength of the metal wires, in a wire-by-wire manner, the numbers of the short pieces composing the third test piece and the fourth test piece should be equal. If a large number of warp metal wires 40 is given as a mixture of metal wires composed of a plurality of species of metal materials, the average value of the flexural strength of such large number of metal wires is used as the flexural strength of the metal wires 40. The same will also apply to the weft metal wires 50.

For example for the metal fabric 10, suitable metal wires may be selected as the warp and the weft, so that the flexural strength of the warp metal wires 40 will be larger than the flexural strength of the weft metal wires 50.

Accordingly, when the weft metal wires 50 are woven under and over a plurality of warp metal wires 40 which are stretched in the longitudinal direction, the weft metal wires 50 can flexibly follow the circumference of the warp metal wires 40, and thereby the warp or weft may be prevented from breaking during weaving.

The metal fabric 10 of this embodiment may also be configured as below, taking advantage of that the warp metal wires 40 and the weft metal wires 50 are composed of different metal materials.

Assuming now the height difference between a warp first apex 42 of the warp metal wires 40 which undulate and extend in a predetermined direction, and a warp second apex 44 of the warp metal wires 40 positioned next to the warp first apex 42, as height difference-A (see FIG. 1B). Also assuming now the height difference between a weft first apex 52 of the weft metal wires 50 which undulate and extend in a predetermined direction, and a weft second apex 54 of the weft metal wires 50 positioned next to the weft first apex, as height difference-B (see FIG. 1C). It is now possible to configure the metal fabric 10 making difference between height difference-A and height difference-B. Height difference-A and height difference-B may be given by the average values obtained by measuring the height difference at the intersections of the warp metal wires 40 and the weft metal wires 50 at a plurality of points (ten randomly selected points, for example). Also when the warp metal wires 40 or the weft metal wires 50 are given in the form of mixture of metal wires composed of a plurality of species of metal materials, the height difference may be given in the same way by the average values of height difference measured at randomly selected intersections.

As one means for embodying such configuration, for example, the warp and the weft may be selected so as to make the flexural strength of the warp metal wires 40 larger than the flexural strength of the weft metal wires 50, and thereby the metal fabric 10 may be configured so as to make height difference-B larger than height difference-A.

If the metal wires are thus selected, in the process of manufacturing the metal fabric 10, the weft metal wires 50 undulate along the periphery of the warp metal wires 40, thereby deformation of the warp metal wires 40 may be suppressed to a lower level. The metal wires which remained less deflected during weaving (warp metal wires 40) have a room for further deflection. Accordingly, even in the process of deep drawing using the metal fabric 10, the metal wires may be deflected in desired directions without being broken.

The metal fabric 10 of this embodiment exemplified above relates to the case where the warp metal wires 40 and the weft metal wires 50 have the same diameter. One specific feature of this embodiment is that the metal fabric 10 may have different physical properties and textures in the warp direction and in the weft direction, despite the same wire diameter. Note however that, as a modified example of this embodiment, the metal fabric 10 may be woven using the warp metal wires 40 and the weft metal wires 50 with different diameters.

The numerical range of the diameter of the warp metal wires 40 and the weft metal wires 50 may suitably be determined depending on applications to which the metal fabric 10 is directed, without special limitation. For example, by selecting the warp metal wires 40 and the weft metal wires 50 of small diameters, the metal fabric 10 can reserve the rigidity of metal in one direction, and can demonstrate the texture of cloth in the other direction. Taking this point into account, it is preferable to select the wire diameters of the warp metal wires 40 and the weft metal wires 50 suitably in the range of 0.01 mm or larger and 0.5 mm or smaller.

The warp metal wires 40 and the weft metal wires 50 used in this embodiment may correlate as follows.

That is, the flexural strength of the weft metal wires 50 may be smaller than the flexural strength of the warp metal wires 40, and, a quotient obtained by dividing tensile rupture strength (N) of the weft metal wires 50 by the flexural strength of the weft metal wires 50, is larger than a quotient obtained by dividing tensile rupture strength (N) of the warp metal wires 40 by the flexural strength of the warp metal wires 40.

The metal fabric 10, using the warp metal wires 40 and the weft metal wires 50 which correlate as described above, shows a good workability in deep drawing.

The tensile rupture strength (N) of the warp metal wires 40 and the weft metal wires 50 may be measured using a tensile testing machine capable of measuring tensile rupture strength of metal wires. Note that the tensile rupture strength (N) of the metal wires in this context means tensile rupture strength per a single metal wire. When the warp metal wires 40 is given in the form of mixture of the metal wires composed of a plurality of species of metal materials, the average value of tensile rupture strength of the individual metal wires is assumed as the tensile rupture strength of the warp metal wires 40. The same will also apply to the weft metal wires 50.

The metal fabric 10 of this embodiment may also be configured so that the flexural strength of the warp metal wires 40 is larger than the flexural strength of the weft metal wires 50, and, so that the ratio of the tensile rupture strength in the direction where the weft metal wires 50 extend, to the tensile rupture strength in the direction where the warp metal wires 40 extend, is 90% or larger and 110% or smaller. In this way, the metal fabric 10 will have equivalent levels of tensile rupture strength both in the warp direction and the weft direction, while retaining the flexibility in the weft direction.

Such configuration of the metal fabric 10 may be embodied, for example, as below. That is, the warp metal wires 40 which show larger flexural strength than the weft metal wires 50 show are selected. In addition, it suffices to make the wire diameter of the weft metal wires 50 suitably larger than that of the warp metal wires 40, or, it suffices to make the number of the weft metal wires 50 per unit area larger than the number of the warp metal wires 40. The tensile rupture strength in the direction where the warp metal wires 40 extend, and the tensile rupture strength in the direction where the weft metal wires 50 extend, in the metal fabric 10, may be measured as described below. First, a rectangular test piece, which is long in the warp direction, is cut out from the metal fabric 10, and also a rectangular test piece, which is long in the weft direction is cut out. Both rectangles have the same dimension. The test pieces are subjected to tensile test using an ordinary tensile testing machine, while aligning the longitudinal direction of the test pieces to the direction where the tensile load is applied. The tensile rupture strength may be determined by measuring the load under which the individual test pieces break.

<Second Embodiment>

Next, in a second embodiment, a curtain 100 as an example of the interior decoration of this invention using the metal fabric of this invention 10, will be explained referring to FIG. 2.

Figure 2:
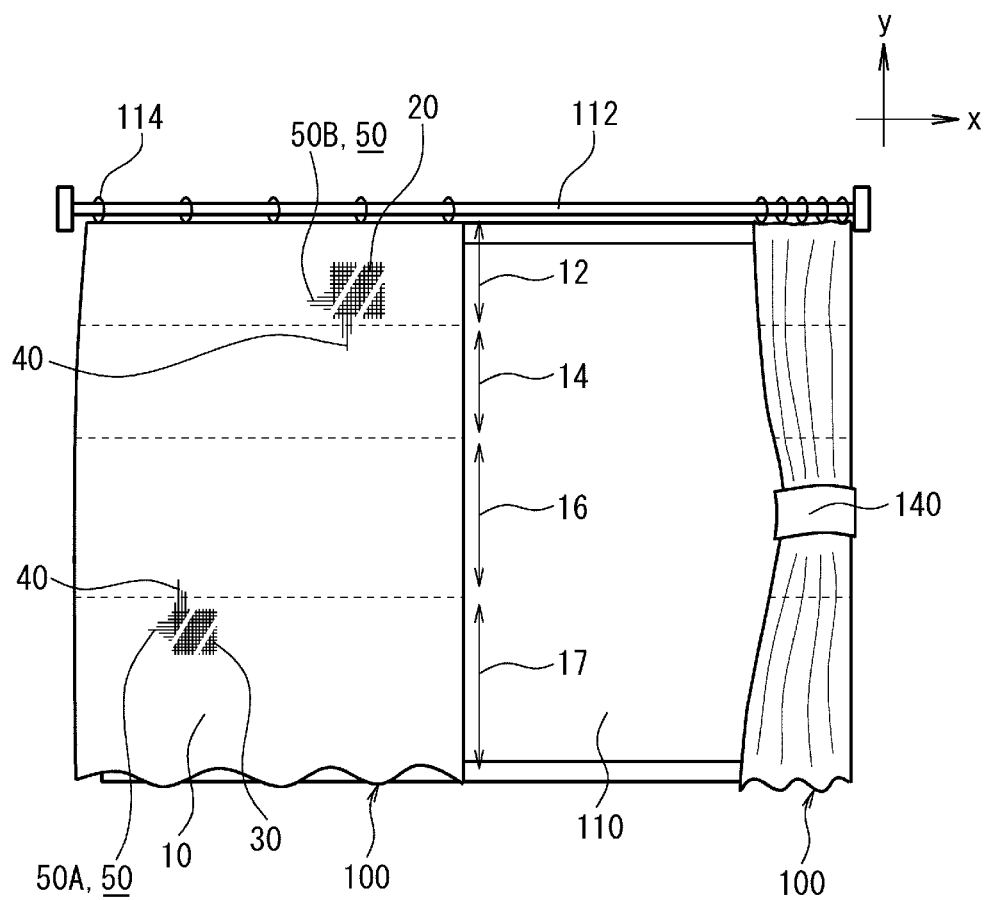
FIG. 2 A front view of a curtain according to a second embodiment of this invention.

FIG. 2 is a front view of the curtain 100 according to the second embodiment of this invention.

The curtain 100 is one example of the interior decoration configured to contain the metal fabric 10.

The interior decoration in this invention encompasses articles in general used for decorating rooms. More specifically, the interior decoration includes articles mainly composed of fabric such as curtain, shop curtain (short split curtain), sofa cover, bed cover, piano cover and table cloth; articles partially using fabric such as sofa, bed and lamp shade; and decorative sheet such as those used for wallpaper.

The interior decoration of this invention exemplified by the curtain 100 can replace the portions, having been configured using cloth, with the metal fabric 10, and can demonstrate unprecedented textures in a variety of interior decorations. Of course, the conventional metal fabrics, having been used for a variety of interior decorations, may be replaced with the metal fabric 10.

The configuration of the curtain 100 will be detailed below.

As illustrated in FIG. 2, the curtain 100 of this embodiment have two sheets of metal fabrics 10 hung so as to cover the window 110.

The metal fabric 10 which composes the curtain 100 has curtain rings 114 attached to one side thereof in the direction where the warp metal wires 40 extend, and are therefore suspended by inserting a curtain rail 112 through the curtain rings 114. The curtain 100 can cover the window 110 from inside of the room, and may be drawn and gathered to the ends of the window 110 and bundled. As illustrated in FIG. 2, the left curtain 100 covers the window 110, and the right curtain 100 is drawn and gathered to the right side of the window 110, and is bundled by a curtain holder 140.

The curtain 100 is composed of the metal fabric 10. The curtain 100 in this embodiment is hung so as to align the warp direction to the direction of hanging (y-direction in the drawing), and the weft direction to the direction of bundling (x-direction in the drawing). The curtain 100, in its modified example not illustrated, may have the weft direction laid in the direction of hanging (y-direction in the drawing), and the warp direction laid in the direction of bundling (x-direction in the drawing).

The curtain 100 in this embodiment 100 is composed of a breadth of metal fabric 10. As a modified example of this embodiment, a plurality of breadths of metal fabrics 10 may be joined in the y-direction or x-direction to configure the curtain 100. Methods of joining one metal fabric 10 and other metal fabric 10 are not specifically limited, wherein the metal fabrics 10 may be aligned in the warp direction and weft direction and may be welded at the overlapped edges, or may be sewed through the meshes. Alternatively, the metal fabric 10 may be joined with other members, such as a metal fabric different from the metal fabric 10, cloth, or resin sheet, to configure the curtain 100. The different fabric in this context encompasses both of the metal fabric of this invention and the conventional metal fabrics.

The metal fabric 10 which composes the curtain 100 is configured so that the flexural strength of the warp metal wires 40 is larger than the flexural strength of the weft metal wires 50. With such configuration, the curtain 100 will have a relatively large rigidity in the direction of hanging, and is less likely to flap in the wind coming through the window, as compared with curtain made of cloth. In contrast, the curtain 100 will have a relatively large flexibility in the direction of bundling, and may be drawn and gathered smoothly in the width direction (x-direction in the drawing) just like curtain made of cloth.

The curtain 100 of this embodiment has, in the direction where the warp metal wires 40 extend as illustrated in FIG. 2, a first woven region 17 wherein first weft metal wires 50A (50) are laterally arranged over a predetermined width. The curtain 100 also has, in a region different from the first woven region 17 and in the direction where the warp metal wires 40 extend, a second woven region 12 wherein second weft metal wires 50B (50) are laterally arranged over a predetermined width. The first weft metal wires 50A and the second weft metal wires 50B are different metal wires.

With the metal fabric 10 thus provided to have the wefts varied from predetermined widthwise region to region in the direction where the warp metal wires 40 extend, the curtain 100 will have a higher design quality as compared with the conventional metal fabric using a single species of weft continuously in the warp direction.

The regions having the wefts varied therein are not always necessarily be two regions in the warp direction, and instead the curtain 100 may have, as illustrated in FIG. 2, a third woven region 16 and a fourth woven region 14 which uses different metal wires as the weft, between the first woven region 17 and the second woven region 12.

Now the first weft metal wires 50A and the second weft metal wires 50B are different metal wires, and for example, the first weft metal wires 50A and the second weft metal wires 50B are metal wires composed of different metal materials. Another possible embodiment is that the first weft metal wires 50A and the second weft metal wires 50B are metal wires composed of the same species of metal material, wherein at least one of them is coated with a colorant, to create different hues to be recognized.

In particular, the principal component of metal contained in the first weft metal wires 50A, and the principal component of metal contained in the second weft metal wires 50B are preferably different.

With such configuration, in the curtain 100, the textures and physical properties of the second woven region 12 and the first woven region 17 may be varied distinctively.

The curtain 100 is partially varied in the number of meshes in the direction where the warp metal wires 40 or the weft metal wires 50 extend.

More specifically, a breadth of metal fabric 10 used for composing the curtain 100 of this embodiment has a coarse region 20 having a relatively small number of meshes or roughly woven, and a dense region 30 having a relatively large number of meshes or finely woven.

More specifically, in the curtain 100 of this embodiment, the number of meshes on the upper side in the warp direction (curtain rail 112 side) is smaller than the number of meshes on the lower side in the warp direction (on the side opposite to the curtain rail 112). In other words, the curtain 100 has the number of meshes switched at an arbitrary point in the longitudinal direction. The curtain 100 of this embodiment has a coarse mesh in the upper part thereof when viewed vertically in the hung state, and has a relatively fine mesh in the lower part. Now the number of meshes means the number of meshes contained within a length of 1 inch (25.4 mm). The numbers of mesh in the warp direction and the weft direction may be same or different. The mesh means an opening surrounded by the warp metal wires 40 and the weft metal wires 50.

By partially varying the number of meshes in the direction where the warp metal wires 40 or the weft metal wires 50 extend, a breadth of metal fabric 10 will have graded breathability.

In short, as a result of such partial modification of the number of meshes, the curtain 100 is partially varied in the breathability in plane.

For example, as illustrated in FIG. 2, the curtain 100 may be made highly breathable in the upper part where the number of meshes is relatively small, meanwhile may be made highly peep-preventive enough to make the indoor less visible from the outdoor, in the lower part where the number of meshes is relatively large.

As described above, by partially varying the number of meshes in the warp direction or in the weft direction, it now becomes possible to guide the airflow through the region having a smaller number of meshes.

<Third Embodiment>

Next, in a third embodiment, a partition member 200 as an example of the partition member of this invention using the metal fabric of this invention 10, will be explained referring to FIG. 3A to FIG. 3C.

Figure 3A:
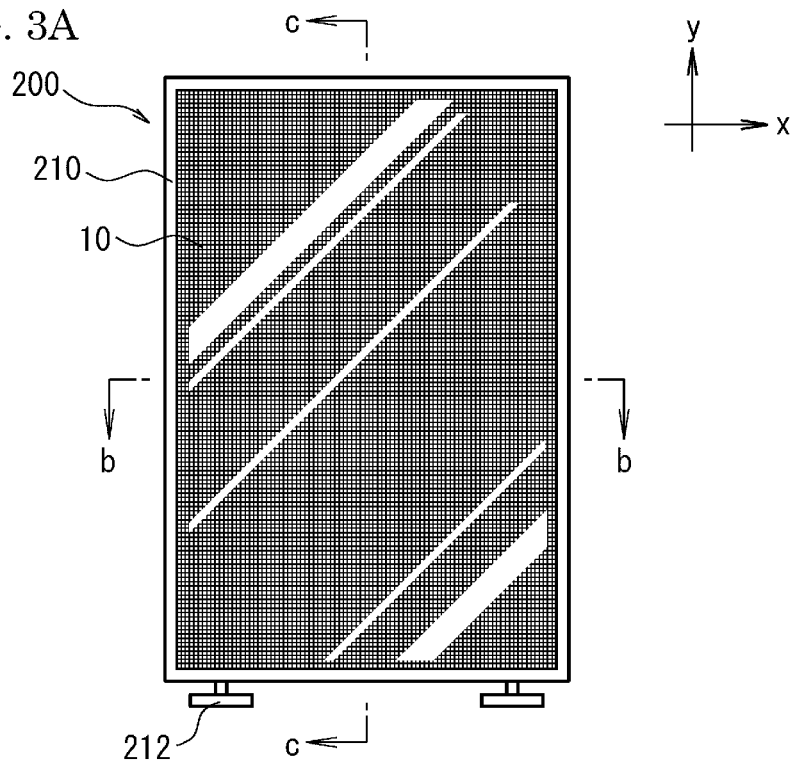
FIG. 3A is a front view of a partition member according to a third embodiment of this invention.
Figure 3B:
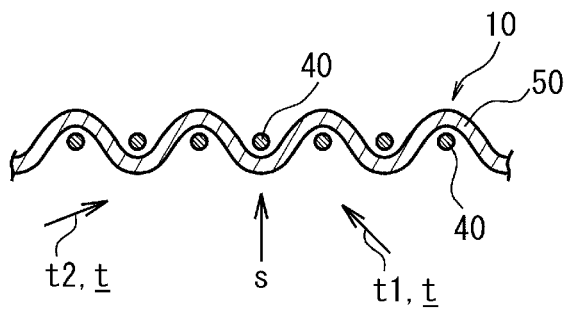
FIG. 3B is a cross-sectional view taken along line b-b in FIG. 3A.
Figure 3C:
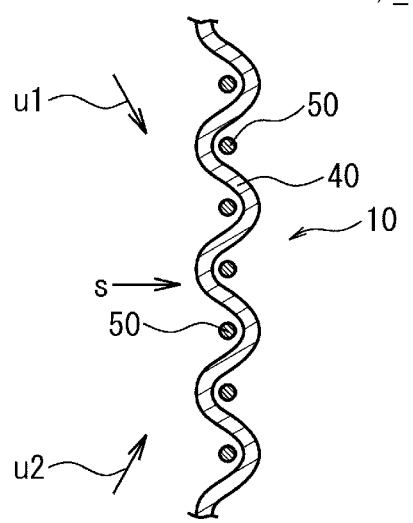
FIG. 3C is a cross-sectional view taken along line c-c in FIG. 3A.

FIG. 3A is a front view of partition member according to the third embodiment of this invention, FIG. 3B is a cross-sectional view taken along line b-b in FIG. 3A, and FIG. 3C is a cross-sectional view taken along line c-c in FIG. 3A.

The partition member 200 has the metal fabric 10, and a frame 210 which supports the outer circumference of the metal fabric 10. The partition member 200 of this embodiment has leg parts 212 which are provided so as to keep the metal fabric 10 supported by the frame 210 almost upright.

The partition member 200 is member used for dividing space, and may be allowed to function as a so-called partition which divides a room space at an arbitrary position.

In the partition member 200 of this embodiment, the metal fabric 10 is used so that the direction where the unillustrated warp metal wires 40 extend is aligned in the upright direction (y-direction in the drawing), and so that the direction where the unillustrated weft metal wires 50 extend is aligned in the width direction (x-direction in the drawing). Note, however, that the directionality of the metal fabric in the member 200 is not limited thereto, instead the direction where the warp metal wires 40 extend and the direction where the weft metal wires 50 extend may be inverted from those described above. Assuming now the width direction is represented by 0 degrees, the metal fabric 10 may be supported by the frame 210 so that the direction where the warp metal wires 40 extend falls in the range which is larger than 0 degrees and smaller than 90 degrees.

The partition member 200 in this embodiment is provided while keeping the metal fabric 10 tensely stretched without sagging in the in-plane direction.

The partition member 200 is aesthetic and has a high design quality, making best use of the apparent texture of the metal fabric 10. The partition member 200 can therefore function to device the room space, and can also demonstrate an excellent decorative effect.

In short, since the different metal materials are used for composing the warp metal wires 40 and the weft metal wires 50, and since they are woven, the metal fabric 10 can show a texture having never been demonstrated by the conventional metal fabric. The present inventors suppose that this is assignable to a special texture demonstrated by weaving the warp metal wires 40 and the weft metal wires 50 which are different in color and material.

The partition member 200 of this embodiment gives different types of visuality when seen, as illustrated in FIG. 3B, in front view direction s and in lateral view direction t, and also gives different types of visuality when seen, as illustrated in FIG. 3C, in the front view direction s, in looking-up direction u1 and in looking-down direction u2. Also the visuality in the lateral view direction t is different from those in the looking-up direction u1 and in the looking-down direction u2. Since the partition member 200 of this embodiment gives different types of visuality depending on the angle of viewing as described above, so that the partition member 200 has a high design quality. Now, the visuality in this context means to sense visually identifiable hue, and visually sensible texture attributable to the material of the metal wire (warmness, cleanliness, etc. for example).

Now the front view direction s is defined as the direction in which the partition member 200 is observed from the front, and in parallel to the normal line on the metal fabric 10. The lateral view direction t is defined as the direction in which the partition member 200 is observed from the left and right, and at an angle inclined from the normal line on the metal fabric 10. The looking-up direction u1 and the looking-down direction u2 are respectively defined as the directions in which the partition member 200 is observed from the upper side to the lower side, and from the lower side to the upper side, and at an angle inclined from the normal line on the metal fabric 10.

The reason why the visuality of the partition member 200 using the metal fabric 10 varies depending on the angle of viewing, as described above, is as follows. In the following explanation, a person who observes the partition member 200 is called "observer".

That is, the observer visually senses, in the front view direction s, a unique texture produced by the warp metal wires 40 and the weft metal wires 50 which overlap in the weave. In the lateral view direction t, the observer recognizes the warp metal wires 40a much, rather than the weft metal wires 50, to thereby strongly sense the color and material of the warp metal wires 40. In the looking-up direction u1 and looking-down direction u2, the observer recognizes the weft metal wires 50 much, rather than the warp metal wires 40, to thereby strongly sense the color and material of the weft metal wires 50. Now as described above, the metal fabric 10 is composed of the warp metal wires 40 and the weft metal wires 50 which are composed of different metal materials having different color and/or material. Therefore the observer can see different illusions of the metal fabric 10 of the partition member 200 respectively in the front view direction s, the lateral view direction t, the looking-up direction u1 and the looking-down direction u2.

The larger the angle of viewing in the lateral view direction t, the larger the visibility of the warp metal wires 40. For example, as illustrated in FIG. 3B, the lateral view direction t (right view direction t1 and left view direction t2) follow the relation below. That is, the angle of viewing between the left view direction t2 where the metal fabric 10 is viewed from the left and the front view direction s, is larger than the angle of viewing between the right view direction t1 where the metal fabric 10 is viewed from the right and the front view direction s. Accordingly, the visibility of the weft metal wires 50 is larger in the left view direction t2 than in the right view direction t1.

For example, the metal fabric 10 using stainless steel for the warp metal wires 40 and using brass for the weft metal wires 50 gives a particularly good appearance.

The partition member 200 using such metal fabric 10 therefore shows a particularly high design quality.

More specifically, stainless steel typically makes the observer sense a silver hue. Meanwhile, brass typically makes the observer sense a gold hue. Therefore, the observer can visually sense a unique texture attributable to the golden metal wires and the silver metal wires woven together. The observer visually senses the silver color of stainless steel used for the warp metal wires 40 much in the lateral view direction t, and visually senses the golden color of brass used for the weft metal wires 50 much in the looking-up direction u1 and in the looking-down direction u2. Such partition member 200 has an excellent design quality allowing the observer to sense a mixed hue of gold and silver, or gold hue, or silver hue, depending on the direction it is observed. For example, when it is desired to make the observer sense much gold hue in the lateral view direction t, it suffices to turn the metal fabric 10 illustrated in FIG. 3A by 90 degrees, so as to lie the warp direction of the metal fabric 10 in the lateral direction of the partition member 200.

<Fourth Embodiment>

Next, in a fourth embodiment, a clothing 300 as an example of the clothing of this invention using the metal fabric of this invention 10, will be explained referring to FIG. 4A and FIG. 4B.

Figure 4A:
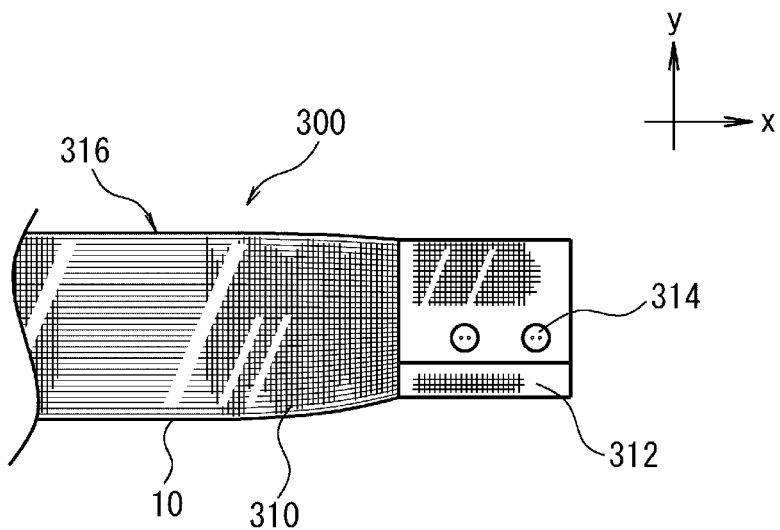
FIG. 4A and FIG. 4B are front views of a sleeve of clothing according to a fourth embodiment of this invention.
Figure 4B:
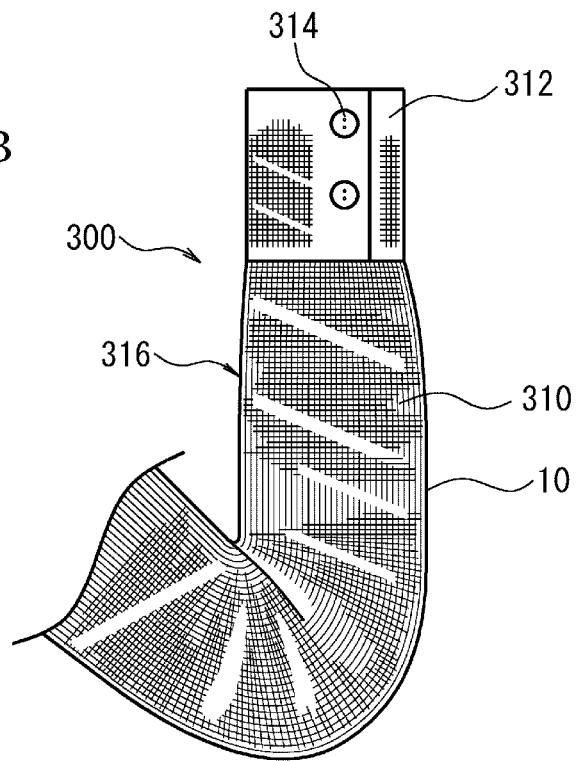

FIG. 4A and FIG. 4B are front views of a sleeve 316 of the clothing 300 according to the fourth embodiment of this invention. FIG. 4A illustrates the sleeve 316 in an unfolded state, and FIG. 4B illustrates the sleeve 316 bent at the elbow.

The clothing 300 of this embodiment is configured to contain the metal fabric 10.

In this invention, the clothing 300 is a general term for articles worn by a person, widely including general clothes, apron, cap, arm cover, socks, gloves and so forth.

The phrase of "the clothing 300 is configured to contain the metal fabric 10" means that the metal fabric 10 is used for at least a part of the clothing 300 (the sleeve 316 in this embodiment). Hence, the clothing 300 includes an embodiment where it is primarily composed of the metal fabric 10 only, and an embodiment where only a part thereof is configured using the metal fabric 10, and other part is configured using other member such as cloth.

The clothing 300 having the metal fabric 10 can demonstrate excellent effects intrinsic to the metal fabric 10, and has functions and design quality having never been found in the conventional metal fabrics.

As described above in other embodiments, the metal fabric 10 can demonstrate rigidity intrinsic to metal either in the warp direction or in the weft direction, and the cloth-like flexibility in the other direction. Hence, as illustrated in FIG. 4A and FIG. 4B, it now becomes possible to configure a three-dimensional portion of the clothing, such as the sleeve 316, using the metal wires.

As illustrated in FIG. 4A and FIG. 4B, the clothing 300 has the sleeve 316. It is arbitrary whether unillustrated portions other than the sleeve 316 (main front piece and main rear piece, for example) are configured by using the metal fabric 10 or not.

The sleeve 316 has a sleeve body 310 and a cuff 312.

The sleeve body 310 is composed of the metal fabric 10. In the metal fabric 10 of the sleeve body 310, either the warp direction or the weft direction is laid in parallel to the longitudinal direction of the sleeve 316 (x-direction in the drawing), and the other is laid in parallel to the circumferential direction of the sleeve 316.

The sleeve body 310 is preferably configured so that the flexural strength of one of the warp metal wires 40 and the weft metal wires 50 laid in the longitudinal direction of the sleeve 316, is larger than that of the other of the warp metal wires 40 and the weft metal wires 50 laid in the circumferential direction of the sleeve 316. With such configuration, the clothing 300 will encounter only a small resistance of the sleeve body 310 when the sleeve 316 is bent as illustrated in FIG. 4B, thereby allows smooth bending and stretching of the arm like the sleeve made of cloth.

The sleeve body 310 may be configured typically so as to align the weft direction, where a relatively small flexural strength appears, to the longitudinal direction of the sleeve 316, and to align the warp direction, where a relatively large flexural strength appears, to the circumferential direction of the sleeve 316.

The cuff 312 is composed of the metal fabric 10 as is the sleeve body 310. Using a breadth of metal fabric 10, a portion from the sleeve body 310 to the cuff 312 may be formed in continuity. Alternatively, the cuff 312 may be configured using a separately formed metal fabric 10, and then the cuff 312 and the sleeve body 310 may be combined.

The clothing 300 using the metal fabric 10 may have a decoration or other component provided to an arbitrary position of the metal fabric 10. For example, the clothing 300 have buttons 314 attached at suitable positions of the cuff 312. The buttons 314 may be decorative ones for mere show, or may be practical components to be fastened in unillustrated button holes provided to the cuff 312.

As an unillustrated modified example of this embodiment, there is exemplified a pannier made of the metal fabric 10. The pannier is a sort of undergarment worn under a skirt to balloon the skirt in the direction away from the body. The pannier has typically been made of firm synthetic fiber, but has not been firm enough in some cases. In contrast, the pannier made of the metal fabric 10 can demonstrate rigidity intrinsic to metal either in the warp direction or the weft direction, and flexibility like cloth in the other direction. Accordingly, the pannier made of the metal fabric 10 can successfully function to balloon the skirt, as compared with the conventional pannier made of synthetic fiber, with a minimum wrong feeling as a clothing worn around the body. Of course, the pannier of this modified example may be provided for example with a cloth lining to the interior thereof, to further improve the wearing comfortability of the pannier as the clothing 300 of this invention.

The pannier using the metal fabric 10 may be configured for example by using the metal wires having a relatively large flexural strength in the upright direction of a person who wears the pannier, and by using the metal wires having a relatively small flexural strength in the circumferential direction around the leg part of the person.

<Fifth Embodiment>

Next, in a fifth embodiment, an electromagnetic shielding member of this invention using the metal fabric of this invention 10, will be explained.

The electromagnetic shielding member of this invention contains the metal fabric 10.

The electromagnetic shielding member of this invention is a member capable of covering a part of, or the entire portion of a device emitting electromagnetic wave, as a result of deep drawing into a desired shape or bending, so as to make full use of properties of the metal fabric 10.

The device emitting electromagnetic wave is exemplified by LED illumination lamp, photovoltaic power generation device (in particular, power conditioner used for the device) and so forth. The metal fabric 10 can be molded easily into any shape suitable for covering target portions of these devices.

The electromagnetic shielding member of this invention used for covering lighting equipment, power generating device or the like preferably shields electromagnetic wave emitted from these devices, while fully allowing visible light to transmit therethrough. From this point of view, it is preferable to control electromagnetic wave shielding coefficient X, given by the equation below, within a predetermined range.

$$X=\text{(visible light transmittance per unit area)}/\text{(electromagnetic wave transmittance per unit area)} \quad \text{(Equation 1)}$$

The predetermined range of X given by Equation 1 varies depending on devices and places where the electromagnetic shielding member of this invention is used. For example, in the devices mainly directed to emit visible light outwardly therefrom, such as illumination lamp, the aperture transmittance per unit area is preferably 90% or larger, and X is preferably 5 or larger. X is more preferably 10 or larger, and even more preferably 15 or larger.

The warp metal wires 40 and the weft metal wires 50 composing the electromagnetic shielding member of this invention are preferably selected, taking the individual electromagnetic wave absorbing characteristics or electromagnetic wave reflecting characteristics into consideration, so as to be suited to the wavelength range (frequency) where the electromagnetic wave is desired to shield. In this way, it becomes now possible to efficiently shield electromagnetic waves in two or more different wavelength ranges.

The embodiments and exemplary applications of this invention have been described above. This invention is however not limited to the description above, and allows various modified or improved embodiments so long as the purpose of this invention will be accomplished. Also usage of this invention may suitably be modified.

For example, the individual embodiments have been described above, referring to the metal fabric 10 composed of the warp metal wires 40 and the weft metal wires 50. The metal fabric of this invention is not limited thereto, instead allowing for example use of other fiber as the warp, between one warp metal wire 40 and the adjacent warp metal wire 40 in the weft direction. Similarly, other fiber is used as the weft between one weft metal wire 50 and the adjacent weft metal wire 50 in the warp direction. The other fiber is exemplified by natural fibers such as cotton yarn or wool yarn, and synthetic fibers such as nylon fiber and polyester fiber. The fibers having been used widely for forming cloth may be juxtaposed between the warp metal wire 40 and the warp metal wire 40, and/or between the weft metal wire 50 and the weft metal wire 50, to form the metal fabric. In this way, a cloth-like texture may be given to the metal fabric in the warp direction and/or in the weft direction.

The description regarding the individual embodiments will suitably apply to other embodiments.

For example, the metal fabric 10 using stainless steel for the warp metal wires 40 and using brass for the weft metal wires 50, as explained in connection with the partition member 200 of the third embodiment, has not only a high level of design quality, but also excellent properties below. That is, since stainless steel has the flexural strength larger than brass has, so that the rigidity of metal is strongly demonstrated relatively in the direction where the metal wires extend. On the other hand, the cloth-like flexibility is demonstrated relatively in the direction where the metal wires made of highly flexible brass extend. Accordingly, the metal fabric 10, which uses stainless steel for the warp metal wires 40 and using brass for the weft metal wires 50, is suitably applicable for example to the curtain 100 of the second embodiment.

The above-described second to fifth embodiments using the metal fabric of this invention do not limit applications of the metal fabric of this invention. The metal fabric of this invention is configured to have the warp metal wires and the weft metal wires composed of different metal materials, such configuration having never been found in any conventional metal material, and is therefore applicable to a wider range of technical field.

For example, by using different metal materials varied in thermal conductivity for the warp metal wires and the weft metal wires in the metal fabric of this invention, it now becomes possible to make difference in thermal conductivity between the warp direction and the weft direction. Accordingly, when heat is input for example to a rectangular metal fabric from one side in the longitudinal direction, the metal fabric allows heat conduction rapidly in the longitudinal direction and gradually in the narrow side direction, to thereby suppress non-uniformity of heat conduction over the plane of the rectangular metal fabric.

This invention will further be detailed, referring to Examples.

The tensile strength of the metal fabric 10 was measured using a constant-rate-of-extension tensile testing machine, in accordance with the cut-strip method specified by JIS L 1096.

Figure 5:
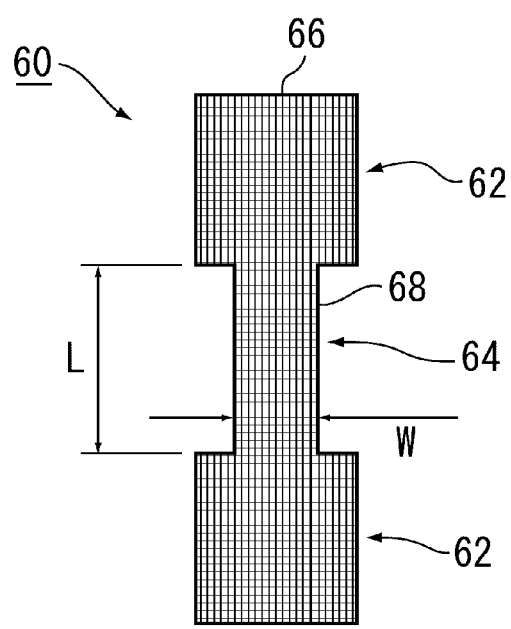
FIG. 5 A drawing illustrating a test piece for measurement of tensile strength of the metal fabric.

More specifically, first the metal fabric 10 of the first embodiment illustrated in FIG. 1A to FIG. 1C was manufactured, and from such metal fabric 10, a plurality of test pieces 60 illustrated in FIG. 5 were cut out. The metal fabric 10 was a plain weave. For the warp metal wires 40 and the weft metal wires 50 of the metal fabric 10, a variety of metal materials described later were used. Meanwhile, in the individual Examples below, the diameter of the warp metal wires 40 and the weft metal wires 50 was commonly set to 0.1 [mm], and the number of meshes of the metal fabric 10 was commonly set to 80 both for the warp direction and the weft direction.

As illustrated in FIG. 5, each test piece 60 has a near H-shape fallen on its side, configured by a strip part 64, and grip parts 62 integrally formed on both sides of the strip part 64 so as to widen it. The strip part 64 was determined to have a length L of 100 mm, and a width W of 25 mm. The test pieces 60 were cut out from the metal fabric 10, so that the warp metal wires 40 or the weft metal wires 50 of the metal fabric 10 lie in the longitudinal direction of the strip part 64. When the longitudinal direction of the strip part 64 (vertical direction in FIG. 5) agrees with the direction where the warp metal wires 40 of the metal fabric 10 extend, the strip part 64 will have the warp metal wires 40 laid in the longitudinal direction thereof. When the width direction of the strip part 64 (lateral direction in FIG. 5) agrees with the direction where the warp metal wires 40 of the metal fabric 10 extend, the strip part 64 will have the weft metal wires 50 laid in the longitudinal direction thereof. The following description will be made without discriminating the warp metal wires 40 and the weft metal wires 50, wherein the metal wires which extend in the longitudinal direction of the test piece 60 will be referred to as "warp 66", and the metal wires which extend in the width direction of the test piece 60 will be referred to as "weft 68".

The warp 66 in the test piece 60 of Example 1 was given as a mixture of metal wires respectively composed of a plurality of species of metal materials, and is more specifically composed of a first warp made of stainless steel (SUS304) and a second warp made of brass, which were arranged alternately. The weft 68 was given as a bundle solely composed of metal wires (first weft) made of stainless steel (SUS304).

The warp 66 in the test piece 60 of Example 2 was given as a bundle solely composed of the metal wires (first warp) made of stainless steel (SUS304). The weft 68 was given as a mixture of the metal wires respectively composed of a plurality of species of metal materials, and is more specifically composed of a first weft made of stainless steel (SUS304) and a second weft made of brass, which were arranged alternately.

The test piece 60 of Example 3 was prepared in the same way as Example 1, except that the weft 68 was given as a bundle solely composed of metal wires (first weft) made of brass.

The warp 66 and the weft 68 of the test pieces 60 of Comparative Example 1 and Comparative Example 2 were respectively given as the bundles solely composed of the metal wires (first warp and first weft) made of stainless steel (SUS304).

At least five pieces each were prepared as the test pieces 60 for Examples 1 to 3 and Comparative Examples 1 and 2. Stainless steel (SUS304) was found to have a tensile strength of approximately 520 $[N/mm^2]$, and a Young's modulus of approximately 197 GPa, meanwhile brass was found to have a tensile strength of 350 $[N/mm^2]$, and a Young's modulus of approximately 100 GPa.

The grip parts 62 of the test piece 60 were respectively fixed to a pair of clamps (not illustrated) of the constant-rate-of-extension tensile testing machine, and the clamps were then moved apart from each other in the longitudinal direction of the strip part 64 at a speed of 5 mm/min. The tensile load was applied in this way to the strip part 64 of the test piece 60 in the direction where the warp 66 extends. The clamps were used to respectively hold the entire portions of the grip parts 62, with a clamping span of 100 mm.

Table 1 below summarizes configurations of the warp 66 and the weft 68, and average values of maximum load observed when the test pieces 60 were pulled by the testing machine until the strip parts 64 were broken. The maximum load is the largest value among measured values, obtained in time series, of the load applied from the testing machine to the test pieces 60. The average value of the maximum load was obtained by respectively measuring the maximum load for Examples and Comparative Examples using at least five each of test pieces 60, and then averaging the measured values.

TABLE 1

| | Warp 66 | | Weft 68 | | Maximum load (Average) |
|---|---|---|---|---|---|
| | First warp | Second warp | First weft | Second weft | |
| Example 1 | SUS304 | Brass | SUS304 | — | 360 [N] |
| Example 2 | SUS304 | — | SUS304 | Brass | 255 [N] |
| Example 3 | SUS304 | Brass | Brass | — | 255 [N] |
| Comparative Example 1 | SUS304 | — | SUS304 | — | 335 [N] |
| Comparative Example 2 | SUS304 | — | SUS304 | — | 323 [N] |

Figure 6:
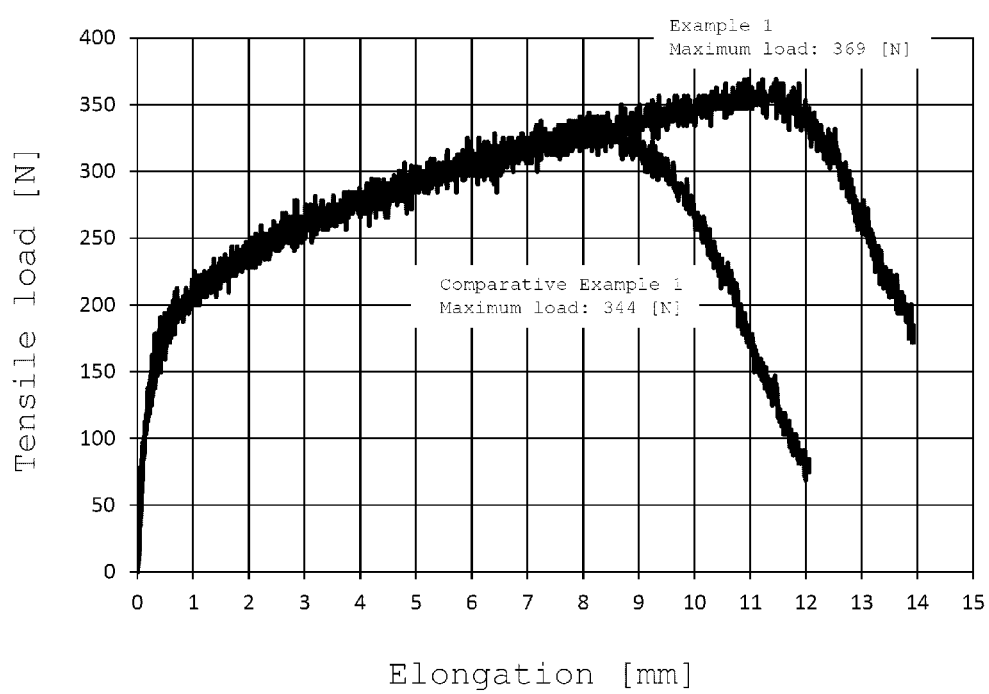
FIG. 6 A graph illustrating relations between the amount of elongation and tensile load regarding Example 1 and Comparative Example 1.

FIG. 6 is a graph illustrating a relation between the amount of elongation and tensile load (maximum load: 369 [N]), regarding one of the plurality of test pieces of Example 1. FIG. 6 also shows a graph illustrating a relation between the amount of elongation and tensile load (maximum load: 344 [N]), regarding one of the plurality of test pieces of Comparative Example 1. The amount of elongation represents a stroke (unit: mm) of the pair of clamps of the testing machine, brought apart from the initial state. The tensile load represents force (unit: N) applied by the pair of clamps to the strip part of the test piece in the longitudinal direction thereof. Similarly, FIG. 7 is a graph illustrating relations between the amount of elongation and tensile load, regarding one of the plurality of test pieces of each of Example 2, Example 3 and Comparative Example 2.

Figure 7:
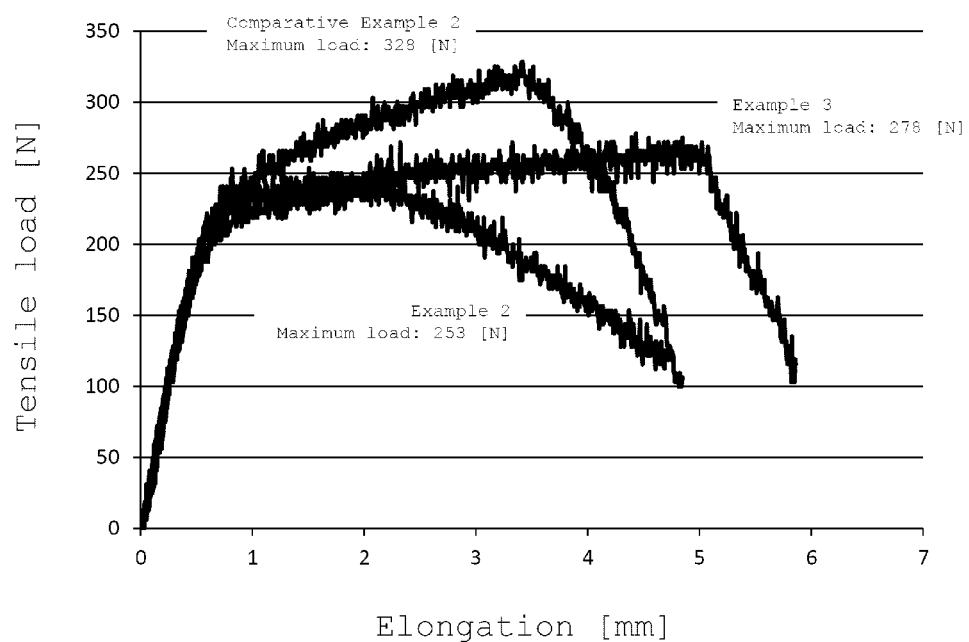
FIG. 7 A graph illustrating relations between the amount of elongation and tensile load regarding Example 2, Example 3 and Comparative Example 2.

The relations between the amount of elongation and tensile load, as appeared in the graphic patterns of FIG. 6 and FIG. 7, will be referred to as "elongation profile".

It was surprising to find, as illustrated in FIG. 6, that the test piece of Example 1, using brass having a lower tensile strength than stainless steel for a part of the warp, and using stainless steel for the residual warp and entire portion of the weft, showed larger maximum load (tensile rupture strength) than that shown by the test piece of Comparative Example 1 using stainless steel for the entire portions of the warp and the weft. It was also found from the graph in FIG. 6 that the elongation profile of the test piece of Example 1 and the test piece of Comparative Example 1 were approximately same, up to the level represented by an amount of elongation of 8 mm or around. The test piece of Comparative Example 1, having the warp and the weft solely composed of the metal wires made of stainless steel, was found to break when the amount of elongation exceeded 8 mm under a tensile load of approximately 330 [N], followed by a sharp fall of the tensile load relative to increase in the amount of elongation. In contrast, the test piece of Example 1, in which the warp mainly applied with the tensile load is made of stainless steel and brass, was found to constantly increase in the tensile load up to the level where the amount of elongation exceeds 11 mm, and then found to break.

When the test piece breaks, the warp (warp metal wires 40) tensed by the applied tensile load is pressurized on both sides thereof by the wefts (weft metal wires 50) at the intersections of the warp and the weft as illustrated in FIG. 1B, and thereby rupture of the warp was supposed to initiate. In contrast, in Example 1 whose warp was obtained by partially mixing brass, having smaller Young's modulus than stainless steel, the warp made of brass can flexibly deform at the intersections of the warp and the weft, thereby it was supposed that the shearing force applied to the warp was reduced, and the warp was suppressed from breaking up to the level represented by a tensile load of approximately 350 [N].

It was understood from comparison between Example 1 and Comparative Example 1 that, by using a common weft for the test piece but by partially mixing, with the warp, the metal wire having smaller Young's modulus than that of the warp, it became possible to suppress rupture of the warp, and to achieve high tensile rupture strength.

As illustrated in FIG. 7, the test piece of Comparative Example 2 whose warp and weft are totally composed of the metal wires made of stainless steel (maximum load: 328 [N]), was found to show a sharp fall of tensile load when the amount of elongation exceeded 3 mm. In contrast, both of the test piece of Example 2 whose warp is composed of stainless steel only and whose weft is composed of a mixture of stainless steel and brass, and the test piece of Example 3 whose warp is composed of a mixture of stainless steel and brass and whose weft is composed of brass only, showed maximum load (tensile rupture strength) smaller than the maximum load of the test piece of Comparative Example 2. More specifically, the test piece of Example 2 showed a maximum load of 253 [N], and the test piece of Example 3 showed a maximum load of 278 [N]. The test piece of Example 2, however, showed a slower rate of change in the process of decreasing the tensile load, after it started to break beyond an amount of elongation of 2 mm, as compared with the test piece of Comparative Example 2. From these findings, it was understood that, by mixing the metal wires having a different Young's modulus to the warp as in Example 2, the warp may be prevented from being broken suddenly when the tensile load increases.

It was also found that the test piece of Example 3 broke at a larger amount of elongation as compared with the test piece of Comparative Example 2. More specifically, the test piece of Comparative Example 2 broke at an amount of elongation of approximately 3.5 mm, whereas the test piece of Example 3 broke only after the amount of elongation reached approximately 5 mm. It was found from the result of Example 3 that, by configuring the warp using a mixture of metal wires made of a material having a large Young's modulus (stainless steel) and a material having a small Young's modulus (brass), and by configuring the weft using metal wires made of a material having a small Young's modulus (brass), the maximum amount of elongation was successfully increased while ensuring a suitable level of tensile rupture strength in the warp direction.

From the results of Example 1 to Example 3 described above, it was made clear that the metal fabric, having a variety of characteristics which cannot be obtained from Comparative Example 1 and Comparative Example 2 whose warp and weft are totally composed of the metal wires made of a single species of metal material, was successfully embodied, by configuring one of the warp and the weft using a mixture which contains metal wires composed of a first metal material and metal wires composed of a second metal material, and by configuring the other of the warp and the weft so as not to contain the metal wires composed of a first metal material, but to contain the metal wires composed of a second metal material.

In a fifth embodiment, performances of the metal fabric described above as the electromagnetic shielding member were evaluated. Assuming the case where a site of emission of electromagnetic wave is close to the electromagnetic shielding member, electromagnetic wave shielding characteristics were measured using the KEC method for evaluating near-field shielding effect. Using an RF network/spectrum/impedance analyzer (product number: 4396B) from Agilent Technologies as a measuring instrument, the electromagnetic shielding effects were measured in the range from 100 kHz to 1 GHz.

Figure 8:
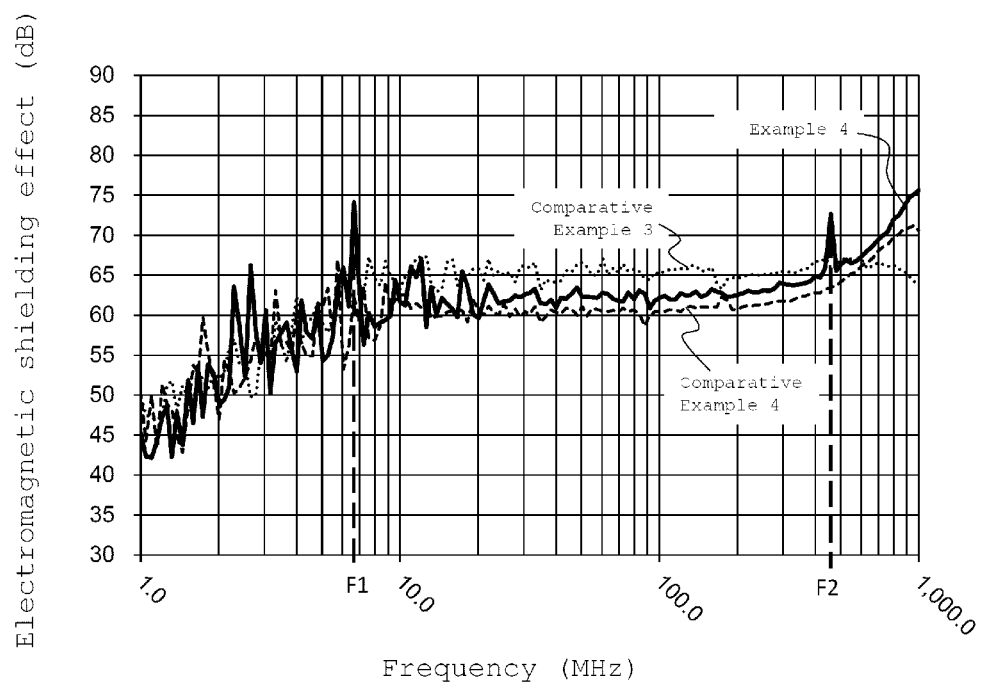
FIG. 8 A graph illustrating electromagnetic shielding effects, in the frequency range from 1 MHz to 1 GHz, of metal fabrics in Example 4, Comparative Example 3 and Comparative Example 4.
Figure 9:
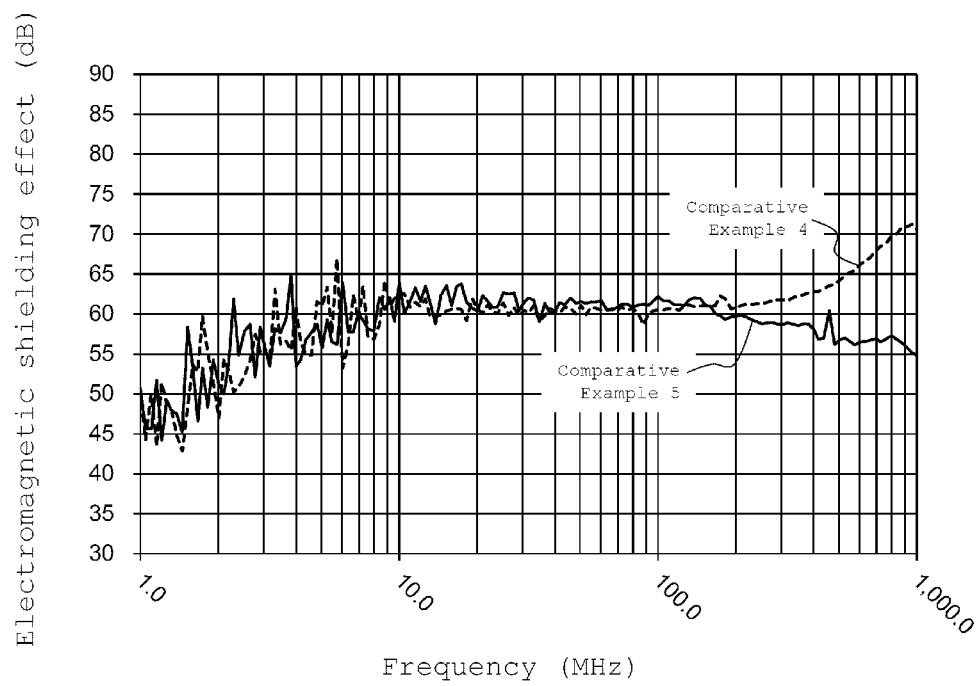
FIG. 9 A graph illustrating electromagnetic shielding effects, in the frequency range from 1 MHz to 1 GHz, of metal fabrics in Comparative Example 4 and Comparative Example 5.

FIG. 8 is a graph illustrating electromagnetic shielding effects of metal fabrics in Example 4, Comparative Example 3 and Comparative Example 4, in the frequency range from 1 MHz to 1 GHz. FIG. 9 is a graph illustrating electromagnetic shielding effects of metal fabrics in Comparative Example 4 and Comparative Example 5, in the frequency range from 1 MHz to 1 GHz.

The metal fabric of Example 4 was configured so that the warp was totally composed of the metal wires made of stainless steel (SUS304), and the weft was totally composed of the metal wires made of brass. The diameter of the warp and the weft was set to 0.1 [mm], and the number of meshes was commonly set to 80 both for the warp direction and the weft direction.

The metal fabric of Comparative Example 3 was configured so that the warp and the weft were totally composed of metal wires made of brass. The diameter of the warp and the weft was set to 0.1 [mm], and the number of meshes was commonly set to 60 both for the warp direction and the weft direction.

The metal fabric of Comparative Example 4 was configured so that the warp and the weft were totally composed of metal wires made of stainless steel (SUS304). The diameter of the warp and the weft was set to 0.1 [mm], and the number of meshes was commonly set to 80 both for the warp direction and the weft direction.

The metal fabric of Comparative Example 5 was configured in the same way as Comparative Example 4, except that the number of meshes was set to 60 both for warp direction and the weft direction.

FIG. 8 and FIG. 9 illustrate average values of results of measurement of electromagnetic wave shielding characteristics, respectively obtained from a plurality of metal fabrics prepared for each of Example 4 and Comparative Examples 3 to 5.

As seen in the results illustrated in FIG. 8, the metal fabric of Example 4 surprisingly showed peaky electromagnetic wave shielding effects at two frequencies points, approximately at 6.6 MHz and 460 MHz, which are found in neither Comparative Example 3 nor Comparative Example 4. More specifically, the metal fabric of Example 4, having the warp made of stainless steel and the weft made of brass, was found to show an electromagnetic wave shielding effect of 74 dB at a frequency F1 of approximately 6.6 MHz, and 73 dB at a frequency F2 of approximately 460 MHz. It was also found that the electromagnetic wave shielding effect monotonously increased in the high frequency range beyond 600 MHz, and that this tendency remained at least up to 1 GHz.

In contrast, the metal fabric of Comparative Example 3 having the warp and the weft made of brass showed a plurality of maximum values representing the electromagnetic wave shielding effect in the frequency range from 1 MHz to 1 GHz, all of which being 68 dB or smaller. Meanwhile, also the metal fabric of Comparative Example 4 having the warp and the weft made of stainless steel showed a plurality of maximum values representing the electromagnetic wave shielding effect in the frequency range from 1 MHz to 200 MHz, all of which being 67 dB or smaller. Comparative Example 4 was found to show the electromagnetic wave shielding effect monotonously increasing in the high frequency range beyond 600 MHz, in the same way as in Example 4.

It was understood from the results shown in FIG. 9, that the number of meshes was less affective to the electromagnetic wave shielding characteristics. More specifically, Comparative Example 4 with a number of meshes of 80 and Comparative Example 5 with a number of meshes of 60 showed similar electromagnetic wave shielding characteristics in the frequency range of 200 MHz or below, and in particular, showed the same electromagnetic wave shielding effect of 67 dB or smaller in the frequency range from 1 MHz to 100 MHz, both ends inclusive. From these results, it is inferred that the metal fabric of Comparative Example 3 would show electromagnetic wave shielding characteristics similar to those illustrated in FIG. 8, even if the number of meshes of the metal fabric were changed from 60 to 80.

Meanwhile, the metal fabric of Example 4, having a number of meshes of 80, and having the warp made of stainless steel and the weft made of brass, was found to show a high electromagnetic wave shielding effect of 70 dB or above at a plurality of frequency points (F1 and F2), which were not found in Comparative Example 4 and Comparative Example 5 using stainless steel only, and in Comparative Example 3 using brass only. It was understood from these results that, by making the warp and the weft using different metal materials as in the metal fabric of Example 4, it now becomes possible to efficiently shield electromagnetic waves at two or more different frequencies.

As has been described above, the metal fabrics of Examples can suitably shield electromagnetic waves at a plurality of frequencies, such as an electromagnetic noise of several MHz or around emitted from an LED bulb and cellular radio wave of 800 MHz or around.

The above-described embodiments and Examples also encompass the technical ideas described below.

(1) A metal fabric comprising warp metal wires as the warp, and weft metal wires as the weft, the warp metal wires and the weft metal wires being composed of different metal materials.

(2) The metal fabric according to (1), wherein flexural strength in the warp direction and flexural strength in the weft direction are different.

(3) The metal fabric according to (2), wherein flexural strength of the warp metal wires and flexural strength of the weft metal wires are different.

(4) The metal fabric according to (3), wherein the flexural strength of the warp metal wires is larger than the flexural strength of the weft metal wires.

(5) The metal fabric according to any one of (1) to (4), wherein height difference-A between a warp first apex of the warp metal wires which undulate and extend in a predetermined direction, and a warp second apex of the warp metal wires positioned next to the warp first apex, is different from height difference-B between a weft first apex of the weft metal wires which undulate and extend in a predetermined direction, and a weft second apex of the weft metal wires positioned next to the weft first apex.

(6) The metal fabric according to (5), wherein the flexural strength of the warp metal wires is larger than the flexural strength of the weft metal wires, and the height difference-B is larger than the height difference-A.

(7) The metal fabric according to any one of (1) to (6), comprising a first woven region having therein first weft metal wires laterally arranged over a predetermined width, in the direction where the warp metal wires extend, and a second woven region having therein second weft metal wires laterally arranged over a predetermined width, in the direction where the warp metal wires extend, the first weft metal wires and the second weft metal wires being composed of different metal wires.

(8) The metal fabric according to (7), wherein the principal component of metal contained in the first weft metal wires, is different from the principal component of metal contained in the second weft metal wires.

(9) The metal fabric according to any one of (1) to (8), wherein the number of meshes is partially varied, in the direction where the warp metal wires or the weft metal wires extend.

(10) The metal fabric according to any one of (1) to (9), wherein the principal component of metal contained in the warp metal wires, and the principal component of metal contained in the weft metal wires are different.

(11) The metal fabric according to any one of (1) to (10), wherein the warp metal wires are composed of stainless steel, and the weft metal wires are composed of brass.

(12) The metal fabric according to any one of (1) to (11), wherein the flexural strength of the weft metal wires is smaller than the flexural strength of the warp metal wires, and, a quotient obtained by dividing tensile rupture strength (N) of the weft metal wires by the flexural strength of the weft metal wires, is larger than a quotient obtained by dividing tensile rupture strength (N) of the warp metal wires by the flexural strength of the warp metal wires.

(13) An interior decoration configured to contain the metal fabric described in any one of (1) to (12).

(14) A partition member comprising the metal fabric descried in any one of (1) to (12), and a frame which supports the outer circumference of the metal fabric.

(15) A clothing configured to contain the metal fabric described in any one of (1) to (12).

(16) An electromagnetic shielding member configured to contain the metal fabric described in any one of (1) to (12).

This application claims priority on Japanese Patent Application No. 2014-153004, filed Jul. 28, 2014, the entire disclosure of which is incorporated into this application.

The invention claimed is:

1. A metal fabric comprising:

a warp; and a weft, wherein the weft comprises metal wires of a first metal material and metal wires of a second metal material, the first metal material being different from the second metal material, wherein the warp comprises the metal wires of the second metal material, excluding the metal wires of the first metal material, wherein a Young's modulus of the second metal material is larger than a Young's modulus of the first metal material, wherein the metal fabric further comprises a first woven region and a second woven region, the first woven region differently located from the second woven region in a direction where the warp extends, wherein the weft of the first woven region consists of the metal wires of the first metal material, and wherein the weft of the second woven region consists of the metal wires of the second metal material.

2. The metal fabric according to claim 1, wherein flexural strength in the warp direction and flexural strength in the weft direction are different.

3. The metal fabric according to claim 2, wherein flexural strength of the metal wires of the warp and flexural strength of the metal wires of the weft are different.

4. The metal fabric according to claim 3, wherein the flexural strength of the metal wires of the warp is larger than the flexural strength of the metal wires of the weft.

5. The metal fabric according to claim 1, wherein height difference-A between a warp first apex of the metal wires of the warp which undulate and extend in a predetermined direction, and a warp second apex of the metal wires of the warp positioned next to the warp first apex, is different from height difference-B between a weft first apex of the metal wires of the weft which undulate and extend in a predetermined direction, and a weft second apex of the metal wires of the weft positioned next to the weft first apex.

6. The metal fabric according to claim 5, wherein the flexural strength of the metal wires of the warp is larger than the flexural strength of the metal wires of the weft, and the height difference-B is larger than the height difference-A.

7. The metal fabric according to claim 1, wherein the principal component of metal contained in the first metal material is different from the principal component of metal contained in the second metal material.

8. The metal fabric according to claim 1, wherein the metal fabric has meshes formed by the metal wires of the warp and the metal wires of the weft, wherein the metal fabric comprises a coarse region having a first number of the meshes and a dense region having a second number of the meshes, the first number being smaller than the second number.

9. The metal fabric according to claim 1, wherein the principal component of metal contained in the metal wires of the warp, and the principal component of metal contained in the metal wires of the weft are different.

10. The metal fabric according to claim 1, wherein the second metal material is stainless steel, and the first metal material is brass.

11. The metal fabric according to claim 1, wherein the flexural strength of the metal wires of the weft is smaller than the flexural strength of the metal wires of the warp, and, a quotient obtained by dividing tensile rupture strength (N) of the metal wires of the weft by the flexural strength of the metal wires of the weft, is larger than a quotient obtained by dividing tensile rupture strength (N) of the metal wires of the warp by the flexural strength of the metal wires of the warp.

12. An interior decoration configured to contain the metal fabric described in claim 1.

13. A partition member comprising the metal fabric described in claim 1, and a frame which supports the outer circumference of the metal fabric.

14. A clothing configured to contain the metal fabric described in claim 1.

15. An electromagnetic shielding member configured to contain the metal fabric described in claim 1.

16. The metal fabric according to claim 1, wherein the second metal material is stainless steel, and the first metal material is brass.

* * * * *